US012518998B2

(12) United States Patent
Wagner et al.

(10) Patent No.: US 12,518,998 B2
(45) Date of Patent: Jan. 6, 2026

(54) HANDLING SYSTEM FOR FETCHING A SUBSTRATE

(71) Applicant: SEMSYSCO GMBH, Salzburg (AT)

(72) Inventors: Louis Wagner, Waakirchen (DE); Josef Hofauer, Oberwang (AT)

(73) Assignee: SEMSYSCO GMBH, Salzburg (AT)

( * ) Notice: Subject to any disclaimer, the term of this patent is extended or adjusted under 35 U.S.C. 154(b) by 0 days.

(21) Appl. No.: 18/289,518

(22) PCT Filed: Feb. 10, 2022

(86) PCT No.: PCT/EP2022/053249
§ 371 (c)(1),
(2) Date: Nov. 3, 2023

(87) PCT Pub. No.: WO2022/242922
PCT Pub. Date: Nov. 24, 2022

(65) Prior Publication Data

US 2024/0242995 A1 Jul. 18, 2024

(30) Foreign Application Priority Data

May 21, 2021 (EP) .................................... 21175346

(51) Int. Cl.
*H01L 21/677* (2006.01)
*H01L 21/683* (2006.01)
*H01L 21/687* (2006.01)

(52) U.S. Cl.
CPC .. *H01L 21/67766* (2013.01); *H01L 21/67778* (2013.01); *H01L 21/6838* (2013.01); *H01L 21/68707* (2013.01)

(58) Field of Classification Search
CPC ...................... H01L 21/67766; H01L 21/6838
See application file for complete search history.

(56) References Cited

U.S. PATENT DOCUMENTS 6,126,380 A * 10/2000 Hillman ................ H01L 21/681 414/754
7,976,263 B2 * 7/2011 Barker .................. H01L 21/681 414/416.11

(Continued)

FOREIGN PATENT DOCUMENTS

KR 10-2010-0085066 A 7/2010
KR 10-2018-0111550 A 10/2018

OTHER PUBLICATIONS

International Search Report and Written Opinion of the International Searching Authority for Application No. PCT/EP2022/053249, dated May 30, 2022.

(Continued)

*Primary Examiner* — Jonathan Snelting
(74) *Attorney, Agent, or Firm* — MARSHALL, GERSTEIN & BORUN LLP

(57) ABSTRACT

The present invention relates to a handling system for fetching a substrate out of a substrate container, a use of such a handling system, a module comprising a substrate container and such a handling system and a method for fetching a substrate out of a substrate container. The handling system comprises a main assembly and a sub assembly. The sub assembly is moveably attached to the main assembly and moveable relative to the main assembly between a fetch position and a rest position. The sub assembly extends in the fetch position over the main assembly to fetch the substrate out of the substrate container and lies on the main assembly in the rest position to provide a contact between the main assembly and the substrate. The main assembly comprises a plurality of suction means to fasten and straighten the substrate.

22 Claims, 5 Drawing Sheets

43
40
42
41 42 41 41 42 41

(56) References Cited

U.S. PATENT DOCUMENTS

| | | | |
|---|---|---|---|
| 9,728,436 B2 * | 8/2017 | Tabrizi .............. | H01L 21/67754 |
| 11,139,190 B2 * | 10/2021 | Bergantz ................ | B65G 47/90 |
| 2008/0156679 A1 | 7/2008 | Bonora et al. | |
| 2009/0082895 A1 * | 3/2009 | Barker .................... | H01L 21/68<br>414/800 |
| 2012/0230808 A1 | 9/2012 | Oyama et al. | |
| 2017/0203898 A1 | 7/2017 | Hosek et al. | |

OTHER PUBLICATIONS

European Search Report for Application No. 23157749.5 dated May 26, 2023.

European Search Report for Application No. 21175346.2, dated Nov. 18, 2021.

European Communication pursuant to Article 94(3) EPC for Application No. 21175346.2, dated Apr. 19, 2022.

Taiwanese Office Action for Application No. 111108444 dated May 31, 2023 with translation.

Korean Office Action with English translation for Application No. 10-2023-7042677, dated Oct. 31, 2025.

* cited by examiner

HANDLING SYSTEM FOR FETCHING A SUBSTRATE

CROSS-REFERENCE TO RELATED APPLICATION

This present application is the US national phase of International Patent Application No. PCT/EP2022/053249, filed Feb. 10, 2022, which claims priority to European Application No. 21175346.2, filed May 21, 2021. These applications are hereby incorporated by reference in their entireties.

TECHNICAL FIELD

The present invention relates to a handling system for fetching a substrate out of a substrate container, a use of such a handling system, a module comprising a substrate container and such a handling system and a method for fetching a substrate out of a substrate container.

BACKGROUND ART

Wafer processing and in general substrate processing in semiconductor and adjacent industries (packaging, solar panels, etc.) requires very often a reliable handling of thin substrates. The reliable handling of thin substrates may include picking up, placing or replacing the substrates in a vertical or horizontal position from a storage cassette or a robot handling in a process tool without scratching, breaking, strongly bending or even cracking the substrate.

Conventional means of transportation for substrates in a modern semiconductor factory is a Front Opening Unified Pod (FOUP). The FOUP is a tray-like container in which, depending on a size, e.g. 6 to 12 substrates can be transported in a controlled condition. The FOUP may be placed on a load port in front of a semiconductor tool. When placed, the FOUP's front door may open so that the substrates can be removed by a mechanical mechanism and transported through the tool.

The substrates can be made of e.g. glass or copper, which have different properties in terms of weight, size, warpage and orientation of the process area, which can be on one or both sides of the substrates. These substrates must be removed individually from the FOUP in order to be e.g. aligned and also to optically read any codes (e.g. barcode, QR code, notches), if necessary. Afterwards, the substrates are placed precisely into a substrate holder for further processing in e.g. wet chemical baths.

Such a transport process of the substrates has to enable a simple, fast and automatic loading and unloading of substrates or panels and only a predefined limited section of the substrates may be touched or held. Further, the transport mechanism has to ensure the substrates having a defined warpage at any time.

SUMMARY

Hence, there may be a need to provide an improved handling system for fetching a substrate out of a substrate container, which facilitates a secure and reliable transport of the substrate.

The problem is solved by the subject matter of the independent claims of the present invention, wherein further embodiments are incorporated in the dependent claims. It should be noted that the aspects of the disclosure described in the following apply to the handling system for fetching a substrate out of a substrate container, the use of such a handling system, the module comprising a substrate container and such a handling system and the method for fetching a substrate out of a substrate container.

According to the present invention, a handling system for fetching a substrate out of a substrate container is presented. The handling system comprises a main assembly and a sub assembly. The sub assembly is moveably attached to the main assembly and moveable relative to the main assembly between a fetch position and a rest position. The sub assembly extends in the fetch position over the main assembly to fetch the substrate out of the substrate container and lies on the main assembly in the rest position to provide a contact between the main assembly and the substrate. The main assembly comprises suction means and in particular a plurality of suction means to fasten and straighten the substrate.

The handling system according to the present invention allows a simple, fast and automatic loading and unloading of substrates, as well as a transport of the substrate with a defined warpage of the substrate at any time. Further, only a predefined dedicated area of the substrate may be held or touched by the handling system. In addition, a handling of single or double side(s) of the substrate may be available and a risk of a substrate breakage due to shock spikes or any resonant vibrations during the transport and/or clamping mechanisms may be reduced or even eliminated.

The substrate transported by the handling system according to the present invention can be positioned and handled with an accuracy of +/−1 mm or less. An adequate mechanical stability during an entire process sequence may be ensured and any risk for creating or depositing surface particles or other substrate contaminations may be avoided.

The substrate container may provide a space for housing substrates in a controlled condition between machines before and/or after a chemical and/or electrolytic surface treatment of the substrate. The substrate container may be for example a Front Opening Unified Pod (FOUP) and particularly configured to receive large size substrates, for instance 750 mm×650 mm or lager. The substrate container may hermetically seal the substrates from the environment so that dust particles, humidity etc. suspended in the air are prevented from polluting and/or damaging the substrates.

The substrate may be a thin or ultra-thin panel with a thickness of between 100 μm and 3 mm. The thickness of the substrate may be also from several hundreds to below 100 micrometers, preferably 10 to 750 μm, and more preferably 20 to 100 μm. Substrates with such a thickness are often very fragile and already initially bent, may be due to gravitational forces, stress within the material or the like. This means, thin substrates often do not have or form a planar surface when being held without support. The substrate may be a conductor plate, a semi-conductor substrate, a film substrate, an essentially plate-shaped, metal or metallized workpiece or the like. The substrate may comprise glass or copper.

The handling system may be configured to carry the substrate out of and/or into the substrate container. The handling system may be divided into two portions, i.e. the main assembly and the sub assembly. The sub assembly may be arranged at the main assembly and moveable relative to the main assembly. The sub assembly may be arranged at an upper side of the main assembly or at a lower side of the main assembly. The main assembly may be a stable construction, which may be connected to a movement means of the handling system such as a robot arm. Whereas, the sub assembly may be formed very slim and configured to shift its position between the fetch position and the rest position.

In other words, the handling system may be extendable based on a movement of the sub assembly relative to the main assembly.

The fetch position may be understood as the position, in which the substrate may be loaded on the sub assembly inside the substrate container. In the rest position, the sub assembly loading the substrate may be retracted in direction of the main assembly. If the substrate is loaded on the sub assembly and the substrate and the sub assembly are moved to the rest position, the substrate may be fixedly held in position mechanically and/or by the suction means, such as (vacuum) suction cups, a Bernoulli plate arranged on the main assembly. The suction cup may be made of an elastic, soft and/or flexible material such as silicone, which may not contaminate the substrate.

At least one, preferably several suction means may be mounted on the main assembly. The suction means may be arranged at a predefined position such that the substrate may be fastened and simultaneously straightened by the plurality of the suction means while the substrate is retained on the main assembly. Accordingly, a controlled handling of the substrate may be ensured without damaging a substrate surface to be processed.

In an example, the sub assembly is moveable in a movement direction parallel to a main extension direction of the main assembly. In other words, the fetch position of the sub assembly may correspond to a main extension direction of the main assembly for transporting the substrate out of the substrate container. The main extension direction of the main assembly may be understood as an elongated direction of the main assembly. Accordingly, the sub assembly may be extended and/or retracted along the elongated direction of the main assembly.

In an example, the sub assembly is moveable in a horizontal direction. Hence, the sub assembly may be moveable in the movement direction parallel to the main extension direction of the main assembly. Further, the sub assembly may be also extendable in a lateral direction relative to the main extension direction of the main assembly. In other words, the sub assembly may be extended and/or retracted in left and/or right direction relative to the elongated direction of the main assembly. Accordingly, the handling system may be flexibly arranged relative to the substrate container, especially in case of a space limitation. Additionally, the handling system may transport the substrates to several substrate containers, which may be arranged around the handling system.

In an example, the sub assembly is moveable relative to the main assembly by means of a rail system. The rail system, which may be arranged between the sub assembly and main assembly, may facilitate a movement of the sub assembly. The rail system may be connected to an actuator such as a cylinder and the rail system may guide the sub assembly during an extension from the main assembly and/or a retraction to the main assembly. Additionally or alternatively, the sub assembly may be also guided by a cylinder system, which may comprise a pneumatic cylinder, an electric cylinder with a linear drive or a hydraulic cylinder.

In an example, the sub assembly may be also moveable in a vertical direction relative to the main assembly and/or along a storing arrangement of the substrates in the substrate container. Accordingly, when fetching the substrate out of the substrate container, the sub assembly may be able to lift the substrate to facilitate the loading of the substrate on the sub assembly. In an example, the sub assembly may be configured to load or unload the substrates having a different thickness. Hence, the sub assembly may be configured to adjust a lift movement with respect to the thickness of the substrates.

In an example, the sub assembly has a fork shape. In other words, the sub assembly may comprise at least two or more elongated rod elements to load the substrate. Preferably, the shape of the sub assembly may be variable with respect to a shape of a substrate fixture or substrate tray in the substrate container. The elongated rod elements may be arranged parallel to the main extension direction of the main assembly and extendable along the main extension direction of the main assembly. The fork-shaped sub assembly may contact only an edge area of the substrate and/or predefined contact area on a surface of the substrate. Accordingly, the sub assembly may not entirely cover a surface of the substrate, but substantially a broad portion of the surface of the substrate may be loaded on the sub assembly free of contact to avoid any damage on the substrate surface.

In an example, the suction means are equally dispensed over the main assembly to control a warpage of the substrate. In other words, the plurality of the suction means may be mounted at the main assembly evenly spaced from each other and configured to adapt the warpage of the substrate or even straighten the substrate. In an example, a Bernoulli-effect means applying pressurized air may be arranged to control a warpage of the substrate.

The term "warpage" may be understood as a corrugation or curvature of the substrate. Accordingly, the suction means or the Bernoulli-effect means may be primarily configured for fastening the substrate on the main assembly and additionally for compensating or adjusting a defined warpage of the substrate. In general, the suction and transport of a straightened substrate is necessary in order to be able to transfer the substrate exactly to another station or a substrate holder. A levelling of the warpage may be necessary to ensure an accurate handover of the substrate to e.g. a substrate holder, which may be achieved by providing the plurality of the suction means at a predefined position on the main assembly.

During operation of the substrate handling system, a first side of the suction means may face the substrate, which may be fixedly held by the suction means, and a second side of the suction means may be connected to a vacuum supply. The suction means may utilize vacuum or reduced pressure to retain the substrate or wafer on the main assembly. Alternatively, the first side of the Bernoulli-effect means may face the substrate, which may be fixedly held by the Bernoulli-effect means, and a second side of the Bernoulli-effect means may be connected to pressurized air.

In an example, the suction means are only arranged along edges of the main assembly to contact the substrate only in touching areas along edges of the substrate. The suction means may contact the substrate only at the predefined touching areas to avoid an unnecessary touch or stress on the substrate by the suction means. Preferably, by arranging the several suction means along edges of the main assembly, a damage risk on the remaining area, which may be chemically or electrochemically treated, may be reduced.

The touching areas may be arranged, for instance at a distance of 10 mm away from each edge of the substrate and at least partially along a circumference of the substrate. The plurality of the suction means may be mounted at the main assembly facing the touching areas of the substrate. Accordingly, the plurality of the suction means may have a contact only with the touching areas of substrate. However, the suction means may be also arranged such that the substrate may be held by the suction means across the substrate surface with respect to the predefined arrangement of the touching areas. In other words, the suction means may be variably arranged with respect to the touching areas, which may be predefined based on application requirements.

In an example, spacer means are arranged at the main assembly to equally straighten the substrate in cooperation with the suction means. The spacer means may be arranged along the arrangement of the suction means, preferably at the main assembly, to control a warpage and/or a straight bending of the substrate in a vertical direction relative to the extending direction of the sub assembly and/or the handling system. Accordingly, the main assembly may not only hold the substrate but also straighten the substrate uniformly by the suction means.

In an example, the main assembly and/or the sub assembly comprise(s) fastening means for the substrate. The fastening means may be clamping means and/or a stopper to fasten the substrate in position during transporting the substrate. The clamping means may be a gripper, which fixedly holds the substrate between gripper arms, or an edge pusher, if the substrate, particularly a process side of the substrate, may not be touched at all. Preferably, the clamping means may be provided in pairs to symmetrically hold the substrate. Alternatively or additionally the sub assembly may comprise at least one stopper at an end edge of the sub assembly to limit the movement of the substrate on the sub assembly. The stopper may be arranged at an edge parallel or perpendicular to the extension direction of the sub assembly.

In an example, the main assembly and/or the sub assembly are/is plate shaped with a reinforcement against deflection and/or a recess. The main assembly and/or the sub assembly may be formed substantially as a plate or a tray to minimize a volume of the handling system. The plate shaped main assembly and/or sub assembly may allow a swift movement of the plate shaped substrates.

The main assembly and/or the sub assembly may be made of a reinforced material such as carbon fiber reinforced polymer (CFRP), glass-fibre reinforced plastic (GFRP), stainless, aluminum or the like and may be further reinforced to provide a lightweight but firm construction. All materials used in the handling system may be suitable for clean rooms and all components contacting the substrates may be electrically conductive (e.g. conductive nitrile rubber composite). The main assembly and/or the sub assembly may be supported by a strut to avoid a deflection and/or recess thereof.

In an example, the handling system further comprises an interface to a robot, wherein the interface is arranged at the main assembly. The interface may be an adapter configured to be coupled with a robot or at least a robot arm. The robot or the robot arm may comprise 2 or up to 6 axes to provide a maximum flexibility in movement of the substrate, when the substrate is loaded on the handling system. Accordingly, the handling system may be displaceable in a vertical, horizontal and/or transverse direction relative to the substrate container to precisely transport the substrate.

The interface may be integrally arranged at the main assembly or fixedly held at the main assembly by screwing, soldering, adhering or the like, which may ensure maximum stability with minimal deflection over a length of the handling system. The interface can be made of metal (e.g. stainless steel, aluminum, etc.) or similar stable materials.

According to the present invention, a use of a handling system as described above for fetching a substrate out of a substrate container is presented. The handling system may be particularly configured to be utilized for a substrate container, which is configured for storing at least one, preferably several substrates in a controlled atmosphere. By a separate arrangement of main assembly and sub assembly of the handling system, the substrate may be fast, secure and automatically transported between the processing tools of the substrates.

According to the present invention, a module is also presented. The module comprises a substrate container and a handling system as described above, which is configured to fetch a substrate out of the substrate container. The substrate container may be a Front Opening Unified Pod (FOUP) comprising an openable door, which may be sealed when closed. The handling system may be arranged facing the openable door of the substrate container to facilitate driving the substrates into the substrate container and/or removing the substrates out of the container. The substrate container may comprise a suitable inner space to receive the substrates in various shapes and sizes from small to large. The substrates may have a size of from 400 mm×400 mm to 750 mm×650 mm and a thickness of from 0.1 mm up to 5 mm.

In an example, the substrate container comprises fixtures to individually hold single substrates of a staple of substrates. Each fixture or each set of fixtures may form a slot, in which an individual substrate may be received to avoid a contact, hence a damage between the substrates. The fixtures or the substrate slots may be arranged in a vertical direction inside the substrate container such that the substrates may be stored in the substrate container over one another to form a vertical staple. Alternatively, the fixtures or the substrate slots may be arranged in a horizontal direction inside the substrate container to store the substrates adjacent or next to each other.

The substrates stored in the substrate container may comprise different thickness and may be arranged with a very small loading gap of about 25 mm. Accordingly, the handling system, particularly the sub assembly may be configured to lift the substrates arranged in a very small intermediate distance.

In an example, the substrate container comprises a lateral opening to fetch the substrate in a movement direction parallel to a main extension direction of the main assembly. In other words, the lateral opening of the substrate container may be positioned in an opposite direction of the main extension direction of the main assembly. Still in other words, the lateral opening may face the sub assembly directly against the movement direction of the sub assembly.

However, the sub assembly may be also extendable over the main assembly in a lateral direction, i.e. left and/or right direction relative to the substrate container such that an arrangement of the lateral opening of the substrate container may not be limited by the movement direction of the sub assembly. Accordingly, the handling system may not be flexibly arranged relative to the substrate container, especially in case of a space limitation. Additionally, the handling system may transport the substrates to several substrate containers, which may be arranged around the handling system.

In an example, the module further comprises a robot connected to a robot interface at the handling system to move the handling system relative to the substrate container. The robot may provide a maximum flexibility in movement of the substrate, when the substrate is loaded on the handling system. Accordingly, the module comprising such a robot may allow the handling system being displaceable in a vertical, horizontal and/or transverse direction relative to the substrate container to precisely transport the substrate.

According to the present invention, a method for fetching a substrate out of a substrate container is presented. The method comprises, but not necessarily in this order: moving a sub assembly relative to a main assembly into a fetch position, wherein the sub assembly in the fetch position extends over the main assembly to fetch the substrate out of the substrate container, moving the sub assembly relative to a main assembly into a rest position, wherein the sub assembly in the rest position lies on the main assembly and provides a contact between the main assembly and the substrate, and fastening and straightening the substrate at the main assembly by a plurality of suction means.

Hence, a simple, fast and automatic loading and unloading of substrates, and a transport of the substrate with a defined warpage may be achieved. In addition, a handling of single or double side(s) of the substrate may be available and a risk of a substrate breakage due to shock spikes or any resonant vibrations during the transport and/or clamping mechanisms may be reduced or even eliminated. An adequate mechanical stability during the whole process sequence may be ensured and any risk for creating or depositing surface particles or other substrate contaminations may be avoided.

In an example, the method further comprises a step of lifting the sub assembly to lift the substrate from a fixture in the substrate container. By a vertical movement of the sub assembly, the substrate, which is placed by the fixture inside the substrate container, may be elevated to be easily fetched out of the fixture, subsequently the substrate container.

In an example, the method further comprises at least one of the steps of aligning the substrate, reading a code on the substrate, transferring the substrate to a process substrate holder, chemically and/or electrically processing the substrate and the like. When the substrate has been fetched out of the substrate container by means of the sub assembly, it can be placed on a storage station, where it can be imaged (e.g. QR code detection, barcode detection, notch detection). After imaging and aligning the substrate, it can be picked up by the main assembly and transported to further stations or substrate holders.

It should be noted that the above embodiments may be combined with each other irrespective of the aspect involved. Accordingly, the method may be combined with structural features and, likewise, the system may be combined with features described above with regard to the method.

These and other aspects of the present invention will become apparent from and elucidated with reference to the embodiments described hereinafter.

BRIEF DESCRIPTION OF DRAWINGS

Exemplary embodiments of the invention will be described in the following with reference to the following drawings.

DESCRIPTION OF EMBODIMENTS

Figure 1:
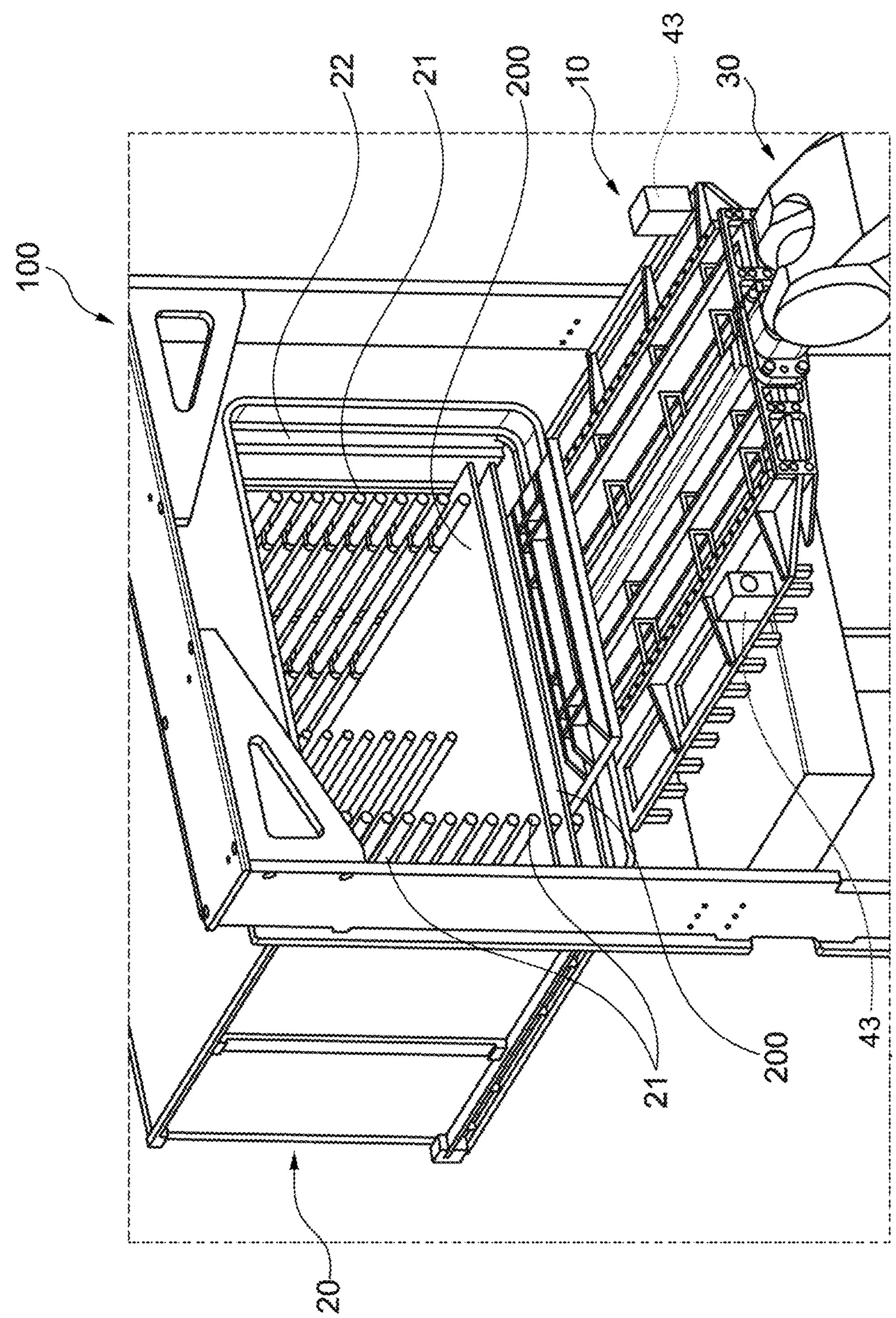
FIG. 1 shows schematically and exemplarily an embodiment of a module comprising a handling system according to the present invention.

FIG. 1 shows a module 100 comprising a substrate container 20 and a handling system 10. The substrate container 20 may be configured to store at least one, preferably several substrates 200 having a different size and/or shape in a controlled condition. The substrate 200 may be a thin or ultra-thin panel or wafer. The substrate container 20 may be, for instance an Opening Unified Pod (FOUP). The substrate container 20 comprises fixtures 21 to individually hold single substrate 200 of a staple of substrates 200. Hence, each single substrate 200 can be arranged in the substrate container 20 vertically and separately from each other. The substrate container 20 further comprises an opening 22 at a lateral side to allow fetching the substrate 200 out of the substrate container 20.

The module 100 further comprises a robot 30 connected to the handling system 10 to move the handling system 10 relative to the substrate container 20. The robot 30 may comprise 2 or up to 6 axes to provide a maximum flexibility in movement of the substrate 200, when the substrate 200 is loaded on the handling system 10. Accordingly, the handling system 10 may be displaceable in a vertical, horizontal and/or transverse direction relative to the substrate container 20 to precisely transport the substrate 200.

Figure 2:
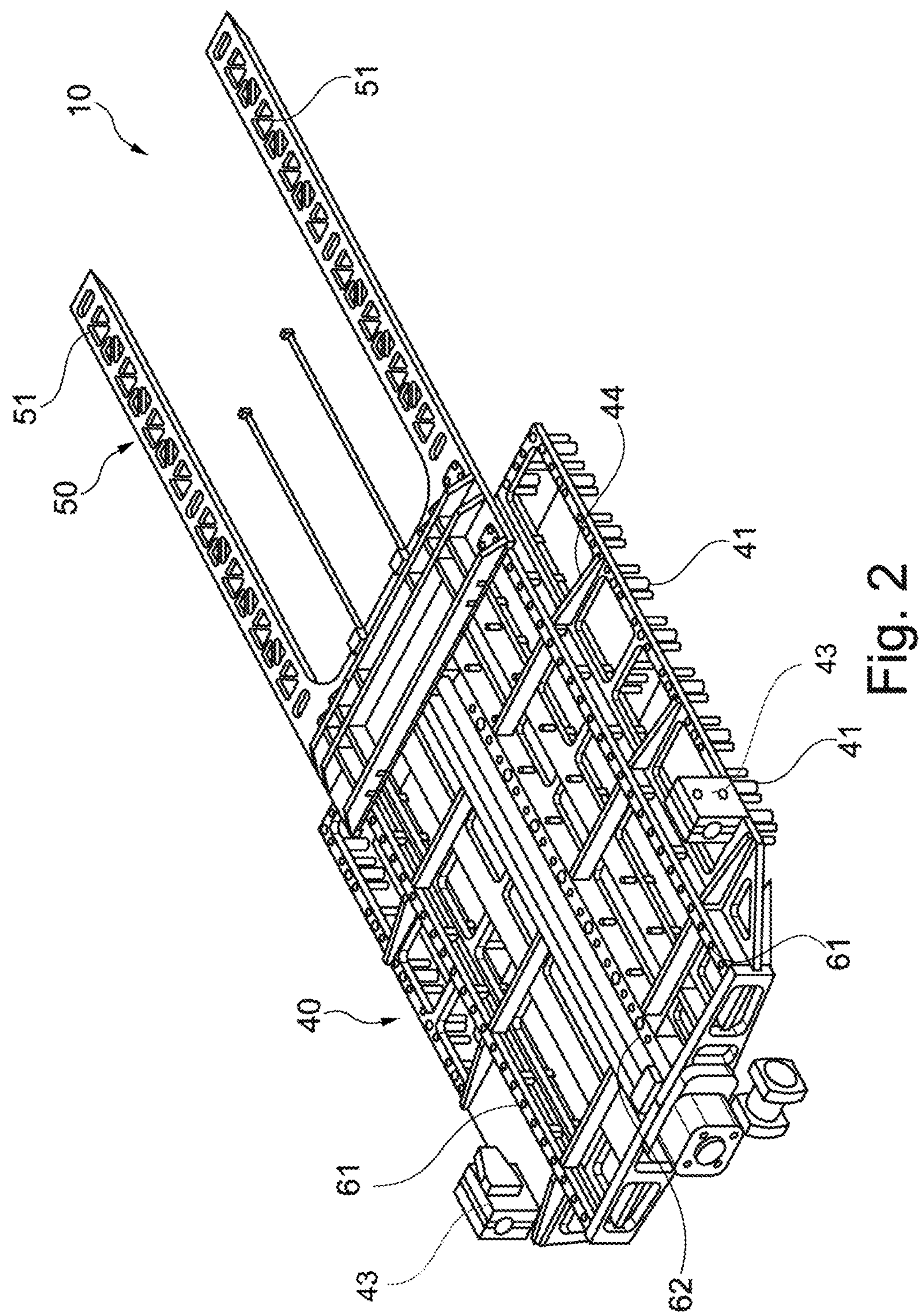
FIG. 2 show schematically and exemplarily an embodiment of a handling system according to the present invention.

The handling system 10 is configured for fetching a substrate 200 out of the substrate container 20. As shown in FIG. 2, the handling system 10 comprises a main assembly 40 and a sub assembly 50. The main assembly 40 and the sub assembly 50 are formed substantially as a plate to minimize a volume of the handling system 10. The plate shaped main assembly 40 and/or sub assembly 50 may allow a swift movement of the plate shaped substrates 200.

The main assembly 40 and/or the sub assembly 50 may be made of a reinforced material such as carbon fiber reinforced polymer (CFRP), glass-fibre reinforced plastic (GFRP), stainless, aluminum or the like and may be further reinforced to provide a lightweight but firm construction. All materials used in the handling system 10 may be suitable for clean rooms and all components contacting the substrates 200 may be electrically conductive (e.g. conductive nitrile rubber composite). The main assembly 40 and/or the sub assembly 50 may be supported by a strut 44 to avoid a deflection and/or recess thereof.

The sub assembly 50 is arranged at an upper side of the main assembly 40 and has a fork shape. In other words, the sub assembly 50 comprises at least two elongated rod elements 51 arranged parallel to a main extension direction of the main assembly 40 and extendable along the main extension direction of the main assembly 40.

The sub assembly 50 is moveably attached to the main assembly 40 and moveable relative to the main assembly 40 between a fetch position and a rest position. In the fetch position, the sub assembly 50 extends over the main assembly 40 to fetch the substrate 200 out of the substrate container 20 and in the rest position, the sub assembly 50 lies on the main assembly 40 to provide a contact between the main assembly 40 and the substrate 200 (see also FIG. 5). In other words, the sub assembly 50 is moveable in a movement direction parallel to the main extension direction of the main assembly 40. Still in other words, the sub assembly 50 is moveable in direction to the opening 22 of the substrate container 20 to fetch the substrate 200 out of the substrate container 20.

The handling system 10 comprises a rail system 61 and/or a pneumatic or electric cylinder 62 arranged between the sub assembly 50 and main assembly 40 (see FIG. 2). The rail system 61 and/or a pneumatic cylinder 62 facilitate a movement of the sub assembly 50, thus guide the sub assembly 50 during an extension from the main assembly 40 and/or a retraction to the main assembly 40.

Figure 3:
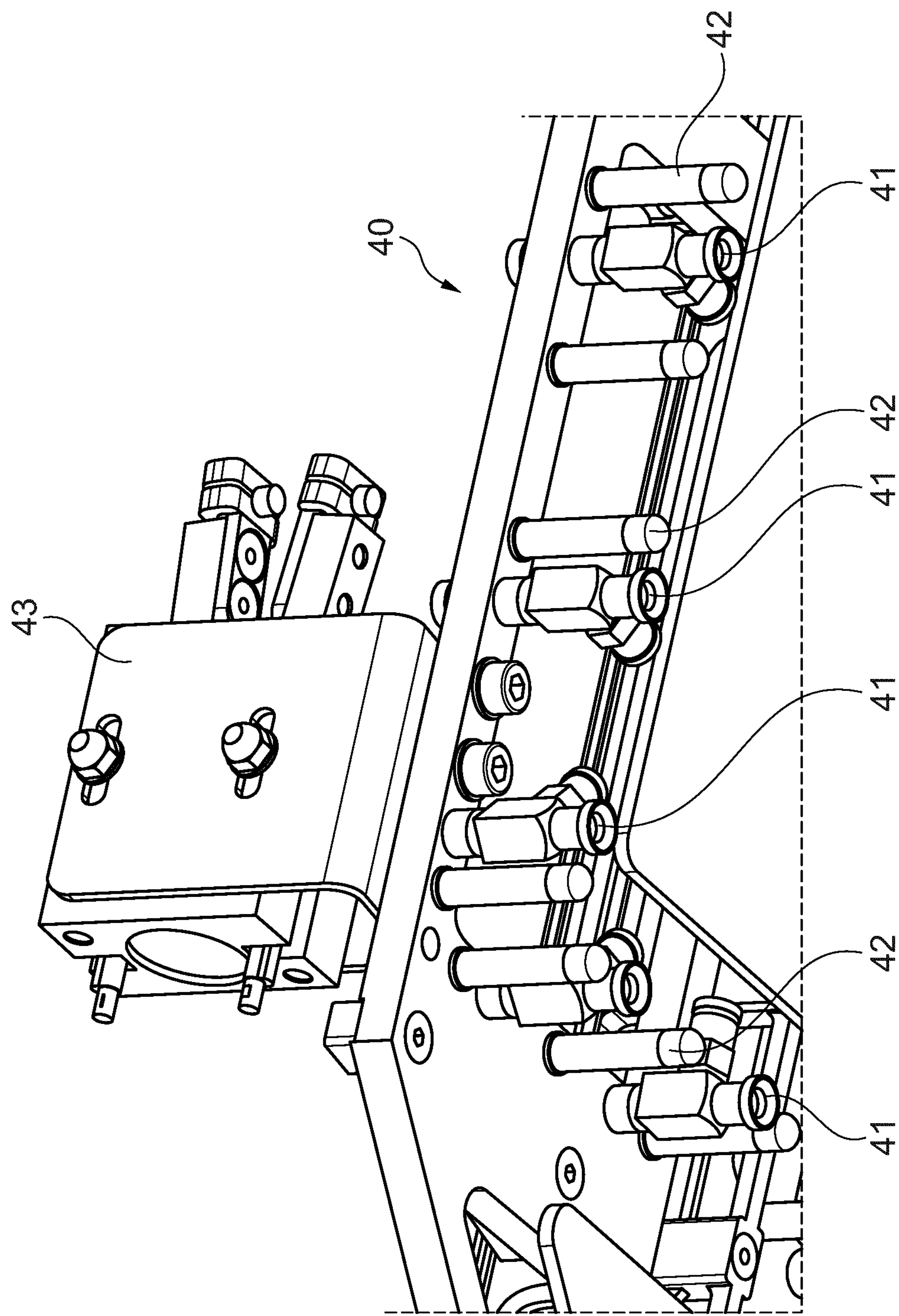
FIG. 3 shows schematically and exemplarily an embodiment of a main assembly according to the present invention.

The main assembly 40 comprises a plurality of suction means 41 to fasten and straighten the substrate. As shown in FIG. 3, the suction means 41 are equally dispensed along edges of the main assembly 40 to control a warpage of the substrate 200 and to contact the substrate 200 only in touching areas along edges of the substrate 200. The touching areas may be arranged, for instance at a distance of 10 mm away from each edge of the substrate 200 and at least partially along a circumference of the substrate 200.

However, the suction means 41 may be also variably arranged with respect to the touching areas, which may be predefined based on application requirements. Accordingly, the suction means 41 are primarily configured for fastening the substrate 200 on the main assembly 40 and additionally for compensating or adjusting a defined warpage. Instead of suction means 41, Bernoulli-effect means applying pressurized air may be arranged for fastening the substrate 200 on the main assembly 40 and adjusting the warpage.

The suction means 41 may face the substrate 200 on one side and they may be connected to a vacuum supply on the other side. Hence, the suction means 41 may utilize vacuum or reduced pressure to retain the substrate 200 or wafer on the main assembly 40. The suction means 41 may be suction cups or Bernoulli plate made of an elastic, soft and/or flexible material. The main assembly 40 further comprises spacer means 42 configured to equally straighten the substrate 200 in cooperation with the suction means 41.

Figure 4:
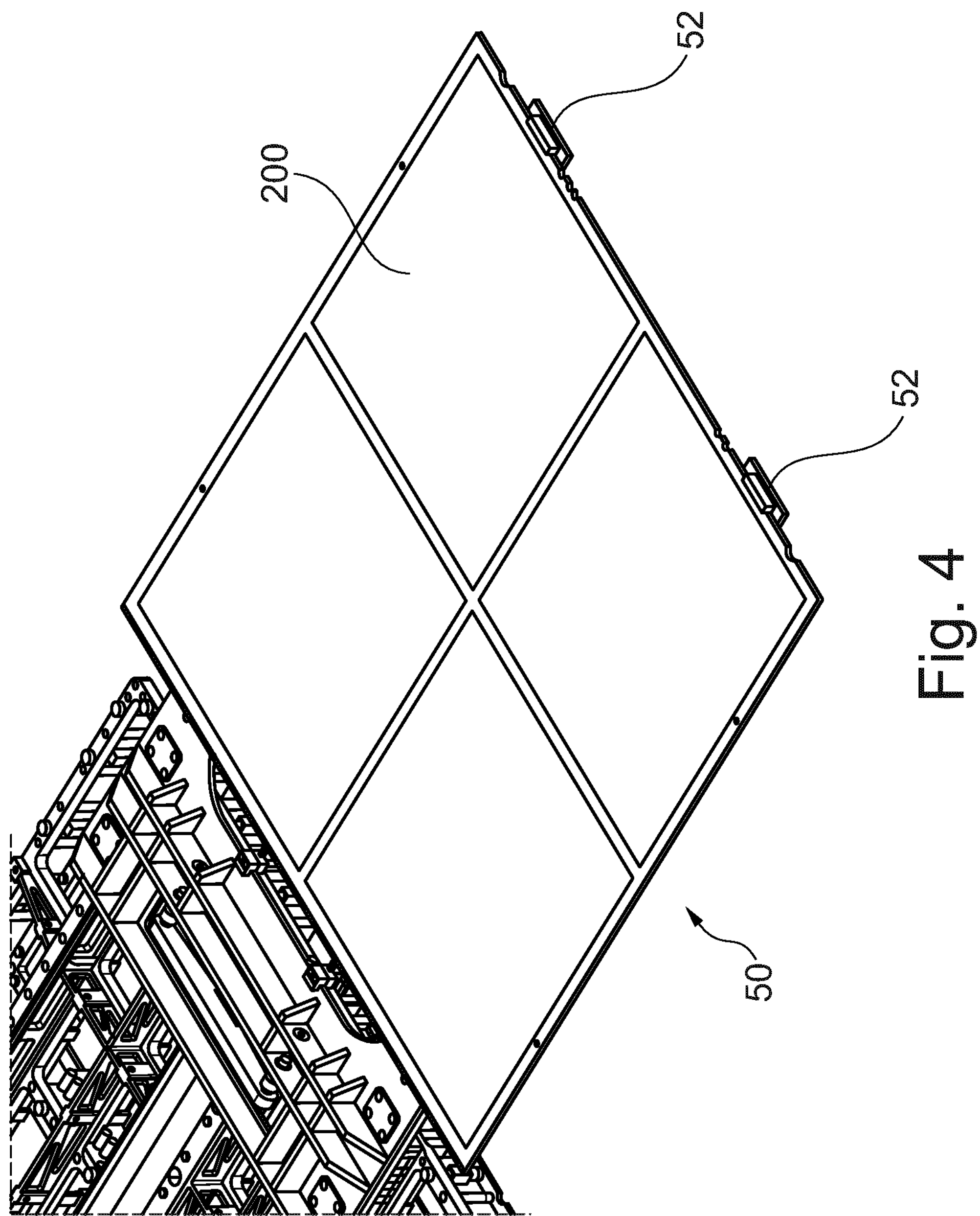
FIG. 4 shows schematically and exemplarily an embodiment of a sub assembly according to the present invention.

The handling system 10 further comprises fastening means 43, 52 for the substrate. As shown in FIG. 3, the main assembly 40 comprises a clamping means 43 comprising gripper arms or edge pushers to hold the substrate 200 therebetween. Additionally, the sub assembly 50 comprises stoppers 52 at an end edge of the sub assembly 50 to limit the movement of the substrate 200 on the sub assembly 50 when transporting (see FIG. 4).

Figure 5:
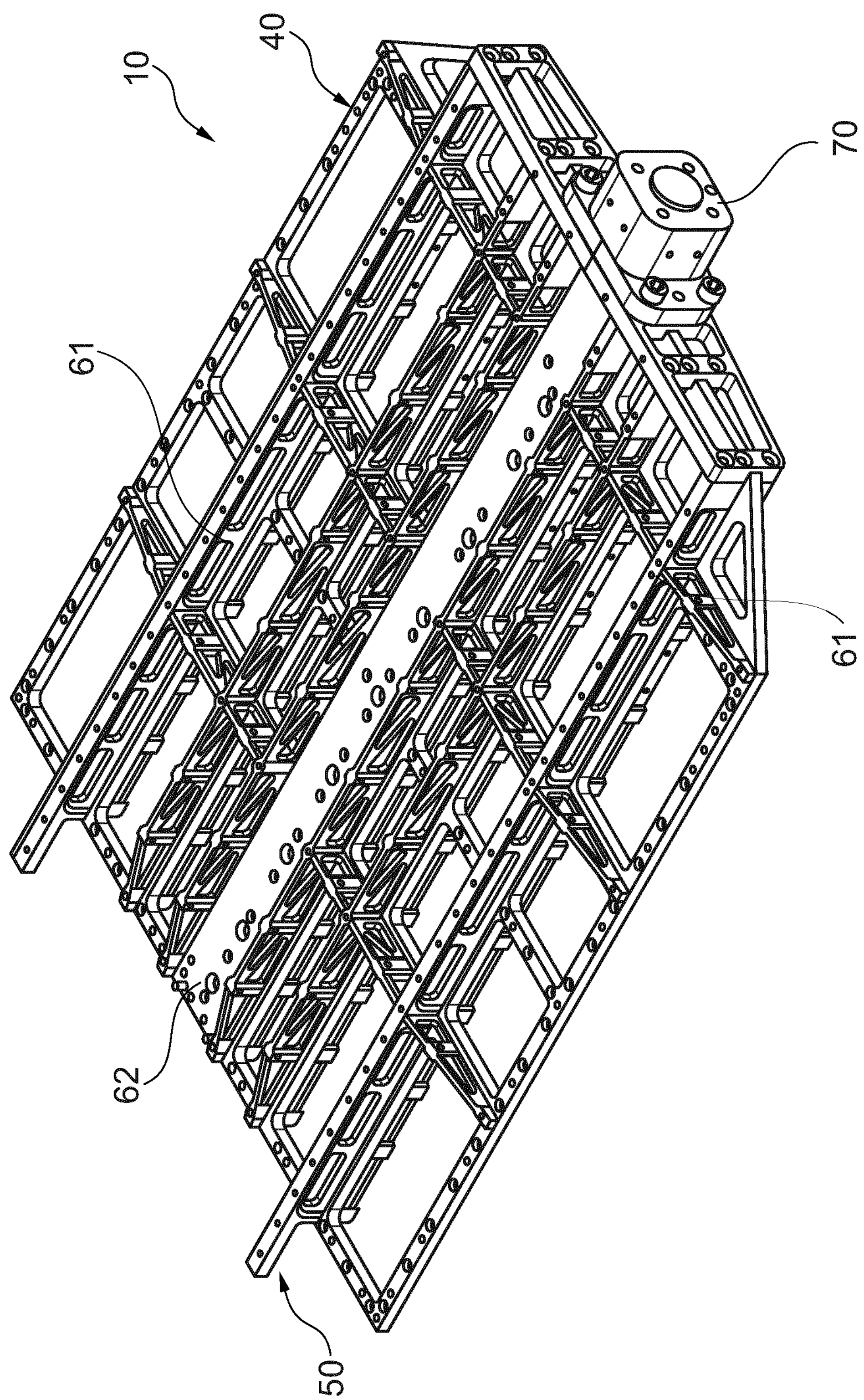
FIG. 5 show schematically and exemplarily an embodiment of a handling system according to the present invention.

The handling system 10 further comprises an interface 70 at the main assembly 40 as shown in FIG. 5. The interface 70 is configured to connect the handling system 10 to the robot 30, thus move the handling system 10 relative to the substrate container 20. The interface 70 is fixedly attached to the main assembly 40 by screwing, soldering, adhering or the like, which may ensure maximum stability with minimal deflection over a length of the handling system 10. The interface 70 can be made of metal (e.g. stainless steel, aluminum, etc.) or similar stable materials.

It has to be noted that embodiments of the disclosure are described with reference to different subject matters. In particular, some embodiments are described with reference to method type claims whereas other embodiments are described with reference to the device type claims. However, a person skilled in the art will gather from the above and the following description that, unless otherwise notified, in addition to any combination of features belonging to one type of subject matter also any combination between features relating to different subject matters is considered to be disclosed with this application. However, all features can be combined providing synergetic effects that are more than the simple summation of the features.

While the disclosure has been illustrated and described in detail in the drawings and description, such illustration and description are to be considered illustrative or exemplary and not restrictive. The disclosure is not limited to the disclosed embodiments. Other variations to the disclosed embodiments can be understood and effected by those skilled in the art in practicing a claimed disclosure, from a study of the drawings, the disclosure, and the dependent claims.

In the claims, the word "comprising" does not exclude other elements or steps, and the indefinite article "a" or "an" does not exclude a plurality. A single processor or other unit may fulfil the functions of several items re-cited in the claims. The mere fact that certain measures are re-cited in mutually different dependent claims does not indicate that a combination of these measures cannot be used to advantage. Any reference signs in the claims should not be construed as limiting the scope.

The invention claimed is:

1. A handling system for fetching a substrate out of a substrate container, comprising:

a main assembly, and a sub assembly, wherein the sub assembly is moveably attached to the main assembly, wherein the sub assembly is moveable relative to the main assembly between a fetch position and a rest position, wherein the sub assembly in the fetch position extends over the main assembly to fetch the substrate out of the substrate container, wherein the sub assembly in the rest position lies on the main assembly to provide a contact between a clamping means of the main assembly and the substrate, wherein the main assembly comprises a plurality of suction means, and wherein the plurality of suction means is configured to fasten and straighten the substrate.

2. The handling system according to claim 1, wherein the sub assembly is moveable in a movement direction parallel to a main extension direction of the main assembly.

3. The handling system according to claim 1, wherein the sub assembly is moveable in a horizontal direction.

4. The handling system according to claim 1, wherein the sub assembly is moveable relative to the main assembly by means of a rail system.

5. The handling system according to claim 1, wherein the sub assembly has a fork shape.

6. The handling system according to claim 1, wherein the suction means are equally dispensed over the main assembly to control a warpage of the substrate.

7. The handling system according to claim 1, wherein the suction means are only arranged along edges of the main assembly to contact the substrate only in touching areas along edges of the substrate.

8. The handling system according to claim 7, wherein the suction means are only arranged along edges of the main assembly at an underside of the main assembly opposite to an upper side of the main assembly, the underside of the main assembly facing away from the sub assembly.

9. The handling system according to claim 1, wherein spacer means are arranged at the main assembly to equally straighten the substrate in cooperation with the suction means.

10. The handling system according to claim 1, wherein the main assembly and/or the sub assembly comprise(s) fastening means for the substrate.

11. The handling system according to claim 1, wherein the main assembly and/or the sub assembly are/is plate shaped with a reinforcement against deflection and/or a recess.

12. The handling system according to claim 1, further comprising an interface to a robot for lifting the handling system relative to the substrate container, wherein the interface is arranged at the main assembly.

13. The handling system according to claim 1, wherein the main assembly comprises the clamping means, the clamping means comprising gripper arms or edge pushers to hold the substrate therebetween.

14. The handling system according to claim 13, wherein the sub assembly further comprises stoppers at an edge of the sub assembly along a length of the substrate to limit a movement of the substrate on the sub assembly.

15. The handling system according claim 1, wherein the clamping means are provided at an upper side of the main assembly facing the sub assembly and the clamping means are provided symmetrically, in pairs to contact the substrate on opposite edges of the substrate along a width of the substrate.

16. The handling system according to claim 1, wherein the main assembly is configured to transport the substrate to several substrate containers that are arranged around the handing system while holding the substrate by the suction means.

17. A module comprising the substrate container and the handling system according to claim 1, wherein the handling system is configured to fetch the substrate out of the substrate container by means of the sub assembly, particularly holding the substrate thereon by means of gravitational force.

18. The module according to claim 17, wherein the substrate container comprises fixtures to individually hold single substrates of a staple of substrates.

19. The module according to claim 17, wherein the substrate container comprises a lateral opening to fetch the substrate in a movement direction parallel to a main extension direction of a main assembly.

20. The module according to claim 17, further comprising a robot connected to a robot interface at the handling system to move the handling system relative to the substrate container.

21. The module according to claim 17, further comprising a storage station for handing over the substrate received from the clamping means of the main assembly to the suction means of the main assembly.

22. The module according to claim 21, wherein the storage station is further configured to image the substrate using at least one of QR code detection, barcode detection, or notch detection, and/or align the substrate with at least one of a QR code, a barcode, or a notch.

* * * * *